United States Patent
Liu (10) Patent No.: US 12,244,161 B2
(45) Date of Patent: Mar. 4, 2025

(54) BATTERY CHARGING MANAGEMENT METHOD AND DEVICE

(71) Applicant: Shenzhen Southking Technology Co., Ltd, Shenzhen (CN)

(72) Inventor: Xianxi Liu, Shenzhen (CN)

(73) Assignee: Shenzhen Southking Technology Co., Ltd, Shenzhen (CN)

( * ) Notice: Subject to any disclaimer, the term of this patent is extended or adjusted under 35 U.S.C. 154(b) by 0 days.

(21) Appl. No.: 18/431,224

(22) Filed: Feb. 2, 2024

(65) Prior Publication Data
US 2024/0297506 A1    Sep. 5, 2024

(30) Foreign Application Priority Data
Mar. 2, 2023    (CN) .......................... 202310192834.6

(51) Int. Cl.
*H02J 7/00* (2006.01)
*G01R 31/367* (2019.01)
*G01R 31/392* (2019.01)

(52) U.S. Cl.
CPC ........ *H02J 7/00036* (2020.01); *G01R 31/367* (2019.01); *G01R 31/392* (2019.01); *H02J 7/00038* (2020.01); *H02J 7/005* (2020.01); *H02J 7/007194* (2020.01)

(58) Field of Classification Search
CPC ................................................ H02J 7/007194
USPC ......................................................... 320/132
See application file for complete search history.

(56) References Cited

U.S. PATENT DOCUMENTS

| | | | | |
|---|---|---|---|---|
| 2021/0126474 A1* | 4/2021 | Zhang | ................... | H02J 7/0047 |
| 2021/0143662 A1* | 5/2021 | Tai | .................... | H02J 7/007188 |
| 2022/0006315 A1* | 1/2022 | Dou | ....................... | H02J 7/0071 |

FOREIGN PATENT DOCUMENTS

| | | |
|---|---|---|
| CN | 109346788 A | 2/2019 |
| CN | 113568812 A | 10/2021 |
| CN | 114216558 A | 3/2022 |
| CN | 114978968 A | 8/2022 |

\* cited by examiner

*Primary Examiner* — Edward Tso
*Assistant Examiner* — Ahmed H Omar
(74) *Attorney, Agent, or Firm* — Hawaii Patent Services; Nathaniel K. Fedde; Kenton N. Fedde (57) ABSTRACT

The present invention relates to the technical field of battery charging, and proposes a battery charging management method and device, comprising: before charging a battery to be charged, obtaining an active handshake signal of the battery to be charged; self-checking the battery to be charged according to the active handshake signal to determine whether the battery to be charged is working normally; when the battery to be charged is working normally, determining a corresponding charging model to charge the battery to be charged. In the present invention, before charging the battery to be charged, an irregularity check is given to the battery to be charged, charging is done when the battery to be charged is working normally and potential safety hazard is avoided.

5 Claims, 3 Drawing Sheets

BATTERY CHARGING MANAGEMENT METHOD AND DEVICE

TECHNICAL FIELD

The present invention relates to the technical field of battery charging, especially a battery charging management method and device.

BACKGROUND TECHNOLOGY

Lithium batteries are common power storage products used for new energy automobiles and electronic products, and safety of batteries dictates the safety of their tasks.

Currently, during battery usage, for a battery management system, usually status parameters of the batteries during charging are much concerned, for example, charging voltage, charging current and charging temperature, to detect whether charging of the batteries is regular according to the charging voltage, charging current and charging temperature. When the batteries are irregular before charging, at this time, safety hazards are liable to occur when charging the batteries. However, currently, there is no solution for checking the batteries before charging, so potential safety hazards exist.

SUMMARY OF THE INVENTION

The main target of the present invention is to provide a battery charging management method and device, in order to overcome the deficiency that currently, potential safety hazards exist as there is no solution for checking the batteries before charging.

To realize the foregoing target, the present invention provides a battery charging management method, comprising:

Before starting charging a battery to be charged, obtaining an active handshake signal of the battery to be charged;
Conducing self-check of the battery to be charged according to the active handshake signal to determine whether the battery to be charged is working normally;
When the battery to be charged is working normally, selecting a corresponding charging mode to charge the battery to be charged.

Further, after selecting the corresponding charging mode to charge the battery to be charged when the battery to be charged is working normally, the present invention further comprising:

When charging the battery to be charged, monitoring a charging status parameter of the battery to be charged;
Judging whether the battery to be charged is working normally according to the charging status parameter;
When the battery to be charged is not working normally, discontinuing charging.

Further, the active handshake signal at least comprises battery life of the battery to be charged;
Conducting self-check for the battery to be charged according to the active handshake signal, to determine whether the battery to be charged is working normally, comprising:

Checking whether the battery life of the battery to be charged is lower than a threshold according to the battery life of the battery to be charged; when the battery life is lower than the threshold, judging the battery to be charged is not working normally.

Further, the active handshake signal at least comprises the battery life of the battery to be charged;

And a method to obtain the battery life of the battery to be charged comprises:

acquiring feature information of the battery to be charged, and determining a corresponding target battery service life prediction model in a database according to the feature information; wherein the target battery service life prediction model comprises a deep learning model that has been trained;
acquiring usage information of the battery to be charged; and
Inputting the usage information to the target battery service life prediction model to predict and obtain the battery life of the battery to be charged.

Further, obtaining the feature information of the battery to be charged, and determining the corresponding target battery service life prediction model in the database according to the feature information comprising:

Obtaining the feature information of the battery to be charged, analyzing the feature information, and obtaining first feature information and second feature information; wherein the first feature information comprises manufacturer information and model information of the battery to be charged, and the second feature information comprises battery type information and battery production process information;
Giving vectorization treatment to the first feature information and the second feature information, and obtaining a first feature vector and a second feature vector; inputting the first feature vector and the second feature vector into a preset decision tree classification model for classification, obtaining the target battery service life prediction model corresponding to classification results; wherein the decision tree classification model is obtained by training in advance a decision tree neural network model.

Further, the charging status parameter comprises a plurality of temperature information collected during charging of the battery;

Wherein judging whether the battery to be charged is working normally according to the charging status parameter comprises:

Finding a number of target temperature information that is bigger than a preset temperature value from the plurality of temperature information;
From the target temperature information that is bigger than the preset temperature value, obtaining a difference value between each of the target temperature information and the preset temperature value, and calculating an average difference between each of the target temperature information and the preset temperature value;
Finding a first possibility in a preset database according to the average difference; and obtaining a second possibility in the preset database according to the number of the target temperature information; wherein in the preset database correlations between the average difference, the number and the possibilities are stored; the first possibility and the second possibility comprise respectively an irregular possibility of the battery to be charged;
Obtaining a weighted value corresponding to the first possibility in the preset database according to the average difference; and obtaining a weighted value corresponding to the second possibility in the preset database according to the number of the target temperature information; wherein correlations between the average difference, the number and the weighted values are stored in the preset database;

Conducting weighted calculation and obtaining a weighted irregular possibility of the battery to be charged according to the first possibility, the second possibility, and the weighted values corresponding to respectively the first possibility and the second possibility;

Judging whether the weighted irregular possibility is bigger than an irregularity threshold, if bigger, judging the battery to be charged is not working normally; if not, judging the battery to be charged is working normally.

The present invention further provided a battery charging management device, comprising:

A signal acquisition unit, configured to obtain an active handshake signal of a battery to be charged before charging the battery to be charged;

An irregularity detection unit, configured to self-check the battery to be charged according to the active handshake signal and determine whether the battery to be charged is working normally; and A charging unit, configured to select a corresponding charging mode to charge the battery to be charged if the battery to be charged is working normally.

Further, the battery charging management device, further comprises:

A monitoring unit, configured to monitor a charging status parameter of the battery to be charged when charging the battery to be charged;

An irregularity judgment unit, configured to judge whether the battery to be charged is working normally according to the charging status parameter; and An irregularity treatment unit, configured to discontinue charging when the battery to be charged is not working normally.

Further, the charging status parameter comprises a plurality of temperature information during charging of the battery;

Wherein the irregularity judging unit is specifically configured to:

Detect a number of target temperature information that is bigger than a preset temperature value from the plurality of temperature information;

Obtain a difference value between each of the target temperature information with the preset temperature value from the target temperature information that is bigger than the preset temperature value, and calculating an average difference value between each of the target temperature information and the preset temperature value;

Obtain a first possibility in a preset database according to the average difference value; and obtain a second possibility in the preset database according to the number of the target temperature information; wherein correlations between the average difference value, the number and the possibilities are stored in the preset database; wherein the first possibility and the second possibility comprise respectively an irregularity possibility of the battery to be charged;

Obtain a weighted value corresponding to the first possibility in the preset database according to the average difference value; and obtain a weighted value corresponding to the second possibility in the preset database according to the number of the target temperature information; wherein correlations between the average difference values, the number and the weighted values are stored in the preset database;

Conduct weighted calculation using the first possibility and the second possibility and the weighted values corresponding to the first possibility and the second possibility and obtain a weighted irregularity possibility of the battery to be charged;

Judge the weighted irregularity possibility is bigger than an irregularity threshold, if bigger, judging the battery to be charged is not working normally; if not, judging the battery to be charged is working normally.

The battery charging management method and device provided in the present invention comprises: before charging a battery to be charged, obtaining an active handshake signal of the battery to be charged; self-checking the battery to be charged according to the active handshake signal to determine whether the battery to be charged is working normally; when the battery to be charged is working normally, determining a corresponding charging model to charge the battery to be charged. In the present invention, before charging the battery to be charged, an irregularity check is given to the battery to be charged, charging is done when the battery to be charged is working normally and potential safety hazard is avoided.

Realization, functional features and advantages of the present invention are to be explained in further details with reference to the drawings and the embodiments.

EMBODIMENTS

To make the targets, the technical solutions and the advantages of the present invention more clear and apparent, a further description will be given to the present invention with reference to the drawings and the embodiments. It shall be comprehensible that, the embodiments given here are only used to explain the present invention rather than limit the present invention.

Figure 1:
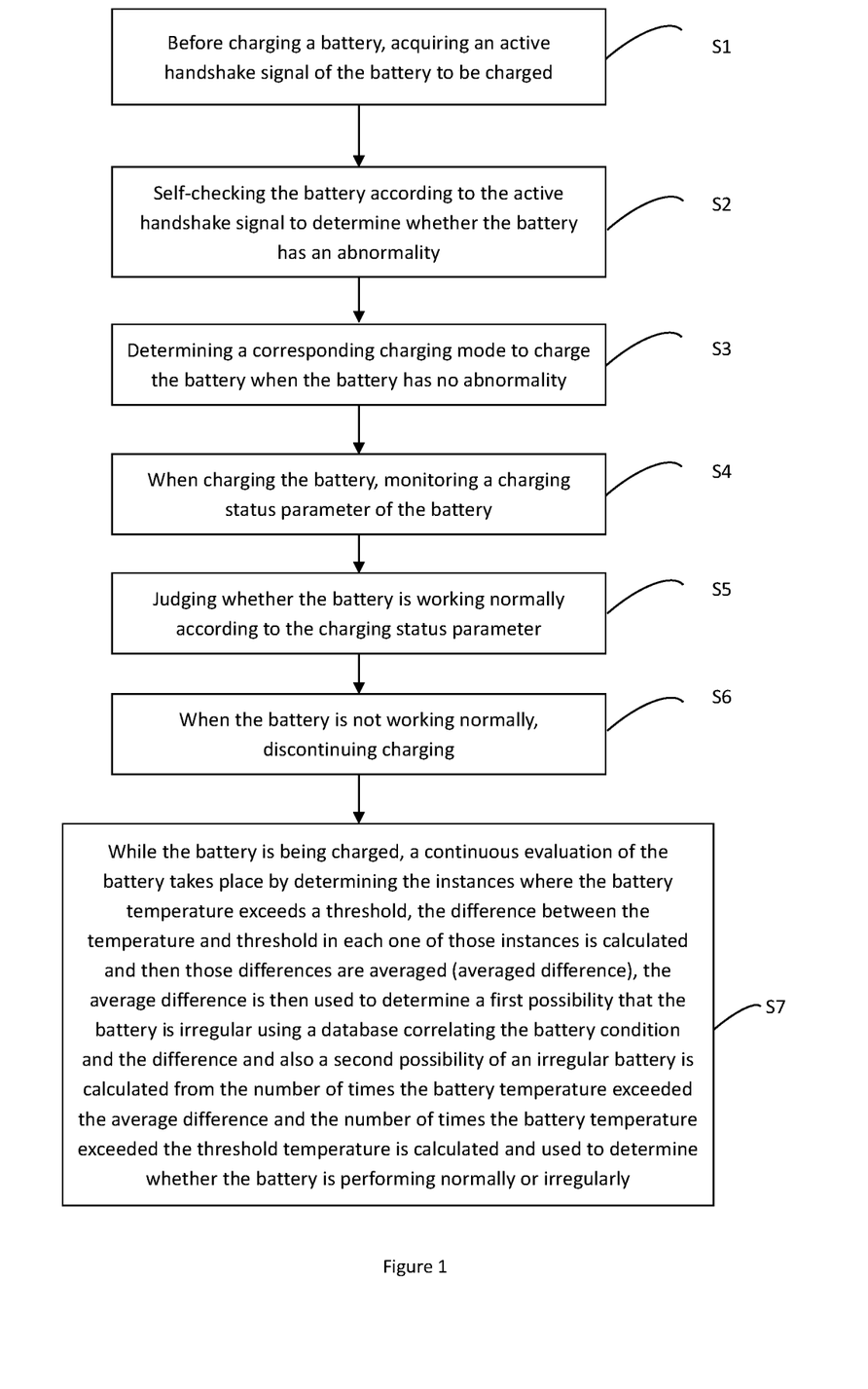
FIG. 1 is a diagram showing steps of a battery charging management method according to an embodiment of the present invention.

With reference to FIG. 1, an embodiment of the present invention provides a battery charging management method, comprising:

Step S1, before charging a battery to be charged, acquiring an active handshake signal of the battery to be charged;

Step S2, self-checking the battery to be charged according to the active handshake signal to determine whether the battery to be charged is working normally; and Step S3, when the battery to be charged is working normally, selecting a corresponding charging mode to charge the battery to be charged.

S4: when charging the battery, monitoring a charging status parameter of the battery;

S5: judging whether the battery is working normally according to the charging status parameter;

S6: when the battery is not working normally, discontinuing charging;

S7: while the battery is being charged, a continuous evaluation of the battery takes place by determining the instances where the battery temperature exceeds a threshold, the difference between the temperature and threshold in each one of those instances is calculated and then those differences are averaged (averaged difference), the average difference is then used to determine a first possibility that the battery is irregular using a database correlating the battery condition and the difference and also a second possibility of an irregular battery is calculated from the number of times the battery temperature exceeded the average difference and the number of times the battery temperature exceeded the threshold temperature is calculated and used to determine whether the battery is performing normally or irregularly In the present embodiment, the present embodiment further comprises to conduct irregularity check for the battery to be charged before charging the battery to be charged. The battery can be a lithium battery, a sode cell and can be used in products such as cellphones, computers and automobiles.

As described in the step S1, before charging the battery to be charged, obtaining the active handshake signal of the battery to be charged, wherein the active handshake signal comprises capacity information, residual power information, battery life, charging voltage, and charging power information of the battery to be charged, when the battery to be charged is not working normally, the foregoing information will change, therefore, the foregoing information can be used to judge whether the battery to be charged is working normally. As described in the foregoing step S2, self-checking the battery to be charged for irregularity according to the foregoing information of the active handshake signal, whether the battery to be charged is working normally can be determined. As described in the foregoing step S3, when the battery to be charged is working normally, charging of the battery can be done, during charging, corresponding charging mode can be selected according to the type, charging power and charging voltage of the battery to be charged to use corresponding charging mode to charge the battery to be charged. When the battery to be charged is not working normally, for example, in condition of charging voltage abnormality, battery life abnormality, at this time, charging will not be done in order to avoid occurrence of safety hazards. In the present embodiment, before charging the battery to be charged, self-checking the battery to be charged, safety hazards can be avoided and charging safety of the battery is promised.

In another embodiment, after the step S3 of determining the corresponding charging mode to charge the battery to be charged when the battery to be charged is working normally, the present embodiment further comprises:

monitoring a charging status parameter of the battery to be charged before charging the battery to be charged;

judging whether the battery to be charged is working normally according to the charging status parameter; and discontinuing charging when the battery to be charged is not working normally.

In the present embodiment, before charging the battery to be charged it is necessary to check whether the battery to be charged is working normally, and during charging the battery to be charged, it is also necessary to check whether the battery to be charged is working normally. Specifically, when charging the battery to be charged, monitoring the charging status parameter of the battery to be charged, and the charging status parameter comprises charging voltage, charging current and charging temperature at the time of charging; per the foregoing charging status parameter it is possible to know whether the battery to be charged is working normally, when the battery is not working normally, discontinuing charging; and when judging the battery to be charged is working normally according to the charging status parameter, charging can be continued.

In an embodiment, the active handshake signal at least comprises a battery life of the battery to be charged;

Wherein self-checking the battery to be charged according to the active handshake signal to determine whether the battery to be charged is working normally comprises:

Checking whether the battery life of the battery to be charged is lower than a threshold according to the battery life of the battery to be charged; when lower than the threshold, judging the battery to be charged is not working normally.

In the present embodiment, the battery life of the battery to be charged can be stored in advance in the management system of the battery and can also be obtained temporarily. It shall be understood that, when the battery life is low, at this time, even after charging the battery cannot provide service for a long time, therefore, low battery life can be judged to be abnormal.

In an embodiment, the active handshake signal at least comprises the battery life of the battery to be charged;

Wherein a method to obtain the battery life of the battery to be charged comprises:

Obtaining feature information of the battery to be charged, and determining a corresponding target battery life prediction model in a database according to the feature information; wherein the target battery life prediction model comprises a trained deep learning model;

Obtaining usage information of the battery to be charged; and

Inputting the usage information to the target battery life prediction model to obtain the battery life of the battery to be charged.

In the present embodiment, in order to predict the battery life for different types of batteries, the feature information of the battery to be charged can be obtained, and the feature information can express the type of the battery to be charged. The feature information can be a feature vector, and can also be text information, expressing manufacturer information, battery manufacturing process information and battery model information. It shall be comprehensible that, with the feature information of the battery to be charged a corresponding target battery life prediction model can be obtained in the database, and to find the target battery life prediction model the method can be one by one searching of the feature information in the form of a mapping table, a classification model can be used to match the feature information in each class and obtain the target battery life prediction model with the highest matching degree. In the present embodiment, different target battery life prediction models can be matched for different batteries to be charged, so as to conduct differentiated battery life prediction.

Upon finding the target battery life prediction model, obtaining the usage information of the battery to be charged; inputting the usage information to the target battery life prediction model to obtain the battery life of the battery to be charged.

In the present embodiment, obtaining the feature information of the battery to be charged, and determining the target battery life prediction model in the database according to the feature information, comprising:

Obtaining the feature information of the battery to be charged, analyzing the feature information and obtaining first feature information and second feature information; the first feature information comprises manufacturer information and battery model information of the battery to be charged and the second feature information comprises battery type information and battery manufacturing process information;

Giving vectorization treatment to the first feature information and the second feature information and obtaining a first feature vector and a second feature vector;

Inputting the first feature vector and the second feature vector into a preset decision tree classification model for classification, obtaining the target battery life prediction model corresponding to classified results; wherein the decision tree classification model is obtained by training of a decision tree neural network model.

In the present embodiment, a method to determine the target battery life prediction model according to the feature information of the battery to be charged is proposed. Specifically, analyzing the feature information of the battery to be charged, and obtaining the manufacturer information and the battery manufacturing process information of the target battery, wherein the second feature information comprises the battery type information and the battery manufacturing process information; as the manufacturer information and the battery type information is different, the rules for manufacturing the battery are different; and even when manufactured by the same manufacturer, the battery type and manufacturing processes can be different; therefore, after analyzing the foregoing feature information, the subsequent differentiated battery life prediction can be done properly.

In the present embodiment, by training the decision tree neural network model the foregoing decision tree classification model can be obtained; before inputting the data to the decision tree classification model, vectorizing the first feature information and the second feature information and obtaining the first feature vector and the second feature vector; inputting respectively the first feature vector and the second feature vector to the preset decision tree classification model, the decision tree classification model comprises a plurality of decision trees, by classifying the first feature vector and the second feature vector class by class, finally the battery life prediction model with the biggest possibility is used as the target battery life prediction model.

In another embodiment, the charging status parameter comprises a plurality of temperature information during charging of the battery;

Wherein judging whether the battery to be charged is working normally according to the charging status parameter comprises:

Checking a number of target temperature information that is bigger than a preset temperature value from the plurality of temperature information;

Obtaining a difference between each of the target temperature information and the preset temperature value from all the target temperature information that is bigger than the preset temperature value, and calculating an average difference between each of the target temperature information and the preset temperature value;

Finding a first possibility in a preset database according to the average difference; and finding a second possibility in the preset database according to the number of target temperature information; wherein in the preset database are stored correlations between the average difference, the number and the possibilities; and the first possibility and the second possibility comprise respectively an irregularity rate of the battery to be charged;

Finding a weighted value corresponding to the first possibility in the preset database; finding a weighted value corresponding to the second possibility in the preset database according to the number of target temperature information; wherein correlations between the average difference, the number and the weighted values are stored in the preset database;

Conducting weighted calculation of the first possibility, the second possibility and the weighted values corresponding to the first possibility and the second possibility and obtaining a weighted irregularity possibility of the battery to be charged;

Judging whether the weighted irregularity possibility is bigger than an irregularity threshold, if bigger, judging the battery to be charged is not working normally; if not, judging the battery to be charged is working normally.

In the present embodiment, the charging status parameter comprising the plurality of temperature information, wherein the plurality of temperature information comprises temperature information at different moments during charging; in the plurality of temperature information, temperature will be different as the time that the temperature is collected is different. By analyzing the plurality of temperature information, the irregularity status of the battery can be detected.

First of all, from the plurality of temperature information, detecting the number of target temperature information that is bigger than the preset temperature value, the preset temperature value can be a safety threshold, when going beyond the preset temperature value, the lithium battery is not working normally. Further, acquiring the difference between each of the target temperature information and the preset temperature value from the target temperature information that is bigger than the preset temperature value, and calculating the average difference between each of the target temperature information and the preset temperature value; the average difference stands for an average state of the temperature of the lithium battery that is higher than the preset temperature value, and is more useful for evaluating the temperature state of the battery. Further, obtaining the first possibility in the preset database according to the average difference; finding the second possibility in the preset database according to the number of the target temperature information, and the first possibility and the second possibility stand for the irregularity possibility of the lithium battery; as the average difference and the number of the target temperature information are indicators for evaluating the status of the battery, therefore they shall be fused for calculation. That is, to conduct weighted calculation based on the first possibility and the second possibility and obtain the weighted irregularity possibility of the battery. Further, judging whether the weighted irregularity possibility is bigger than the irregularity threshold, if bigger, judging the battery to be charged is not working normally; if not, judging the battery to be charged is working normally.

Figure 2:
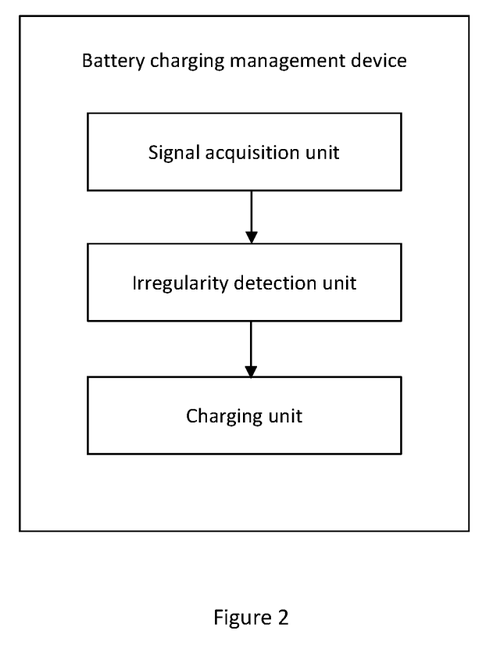
FIG. 2 is a structural diagram showing a battery charging management device according to an embodiment of the present invention.

With reference to FIG. 2, an embodiment of the present invention further provides a battery charging management device, comprising:

A signal acquisition unit, configured to obtain the active handshake signal of the battery to be charged before starting charging the battery to be charged;

An irregularity detection unit, configured to self-check the battery to be charged according to the active handshake signal to determine whether the battery to be charged is working normally;

A charging unit, configured to select a corresponding charging mode to charge the battery to be charged when the battery to be charged is working normally.

Further, the battery charging management device, further comprises:

A monitoring unit, configured to monitor the charging status parameter of the battery to be charged when to charge the battery to be charged;

An irregularity judging unit, configured to judge whether the battery to be charged is working normally according to the charging status parameter; and An irregularity treatment unit, configured to discontinue charging when the battery to be charged is not working normally.

Further, the charging status parameter comprises a plurality of temperature information during charging of the battery;

Wherein the irregularity judging unit is specifically configured to:

Detect a number of target temperature information that is bigger than a preset temperature value from the plurality of temperature information;

Obtain a difference between each of the target temperature information and the preset temperature value from the target temperature information that is bigger than the preset temperature value and calculate an average difference between each of the target temperature information and the preset temperature value;

Obtain a first possibility in a preset database according to the average difference; and obtain a second possibility in the preset database according to the number of the target temperature information; wherein correlations between the average difference, the number and the possibility are stored in the preset database; and the first possibility and the second possibility comprise respectively the irregularity possibility of the battery to be charged;

Obtain a weighted value corresponding to the first possibility in the preset database according to the average difference; obtain a weighted value corresponding to the second possibility in the preset database according to the number of the target temperature information; wherein correlations between the average difference, the number and the weighted values are stored in the preset database;

Conduct weighted calculation according to the first possibility, the second possibility, and the weighted values corresponding to the first possibility and the second possibility, and obtain the weighted irregularity possibility of the battery to be charged;

Judge whether the weighted irregularity possibility is bigger than the irregularity threshold, if bigger, judge the battery to be charged is not working normally; if not, judge the battery to be charged is working normally.

In an embodiment, the active handshake signal at least comprises battery life of the battery to be charged;

Wherein the irregularity detection unit is specifically configured to:

Detect whether the battery life of the battery to be charged is lower than a threshold according to the battery life of the battery to be charged; if lower than the threshold, judge the battery to be charged is not working normally.

Wherein the active handshake signal at least comprises the battery life of the battery to be charged;

A method to acquire the battery life of the battery to be charged comprises:

Obtaining feature information of the battery to be charged, and determining a corresponding target battery life prediction model in the database according to the feature information; wherein the target battery life prediction model comprises a trained deep learning model;

Obtaining usage information of the battery to be charged; and

Inputting the usage information into the target battery life prediction model and predicting and obtaining the battery life of the battery to be charged.

In the present embodiment, obtaining the feature information of the battery to be charged and determining the corresponding target battery life prediction model in the database according to the feature information comprises:

Obtaining the feature information of the battery to be charged, analyzing the feature information, and obtaining first feature information and second feature information; wherein the first feature information comprises manufacturer information and battery type information of the battery to be charged, and the second feature information comprises the battery type information and the battery manufacturing process information;

Giving vectorization treatment to the first feature information and the second feature information and obtaining the first feature vector and the second feature vector;

Inputting the first feature vector and the second feature vector into a predetermined decision tree classification model for classification, and obtaining the target battery life prediction model corresponding to classification results; wherein, the decision tree classification model comprises a trained decision tree neural network model.

In the present embodiment, specific realization of the units of the device in the foregoing embodiment is the same as those set forth in the method embodiment and will not be repeated here.

Figure 3:
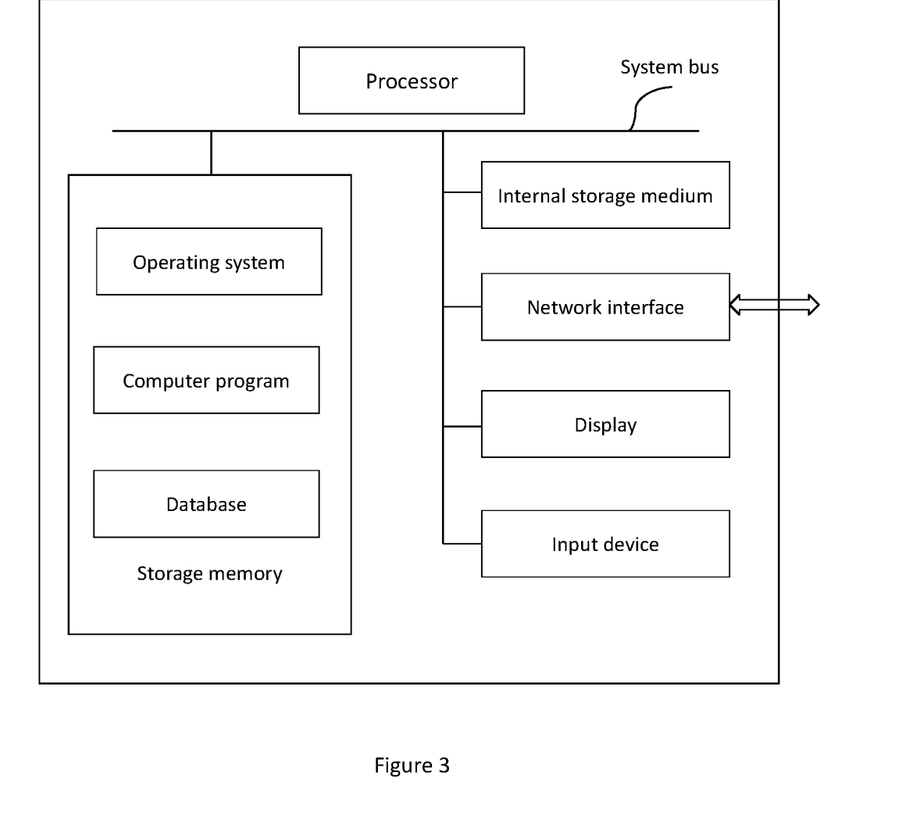
FIG. 3 is a structural diagram showing a computer device according to an embodiment of the present invention.

With reference to FIG. 3, an embodiment of the present invention provides a computer device, wherein the computer device can be a server, and internal structures of the server can be as shown in FIG. 3. The computer device comprises a processor, a memory, at least one network interface and at least one database connected by system bus. Wherein the processor of the computer device is to provide computation and control abilities. The memory of the computer device comprises non-volatile storage media, and internal storage media. The non-volatile storage media is provided with an operation system, at least one computer program and the at least one database. The internal storage media provides an environment for running of the operation system and the at least one computer program of the non-volatile storage media. The at least one database of the computer device is configured to store battery data etc. The at least one network interface of the computer device is configured to communicate with external terminals by networks. The at least one computer program when being executed by the processor will execute the battery charging management method.

Those skilled in the art shall understand that, structures shown in FIG. 3 are only those related to the technical solutions of the present invention and shall not be construed as limitations on the computer device that the technical solutions of the present invention are implemented on.

An embodiment of the present invention further provides a computer readable storage medium, wherein a computer program is stored on the computer readable storage medium, and the computer program when being executed by a processor will execute the battery charging management method. It shall be understood that, the computer readable storage medium in the present embodiment can be a volatile readable storage medium and can also be a non-volatile readable storage medium.

In summary, the battery charging management method and device according to the embodiments of the present invention, comprises: before charging the battery to be charged, acquiring an active handshake signal of the battery to be charged; self-checking the battery to be charged according to the active handshake signal to determine whether the battery to be charged is working normally; when the battery to be charged is working normally, selecting a corresponding charging mode to charge the battery to be charged. In the present invention, before charging the battery to be charged, irregularity check is given to the battery to be charged and when no irregularity is detected, the battery is charged, and potential safety hazards are avoided.

Those of ordinary skill in the art can appreciate that, all or some of the processes in the method embodiments of the present invention can be completed by having the computer program to instruct the corresponding hardware, and the computer program can be stored in a non-volatile computer readable storage medium, and the computer program when being executed, can comprise the processes as defined in the method embodiments. In the present invention, any citation to memory, storage, database and other media comprises non-volatile and/or volatile memory. The non-volatile memory can be read only memory (ROM), programmable ROM (PROM), electronic programmable ROM (EPROM), electronic erasable programmable ROM (EEPROM) or flash memory. The volatile memory can include random access memory (RAM) or external high speed cache memory. As explanatory rather than restrictive, RAM can be obtained in a plurality of forms, for example static RAM (SRAM), dynamic RAM (DRAM), synchronous DRAM (SDRAM), double data rate SDRAM (SSRSDRAM), enhanced SDRAM (ESDRAM), synchlink DRAM (SLDRAM), Rambus direct RAM (RDRAM), direct Rambus dynamic RAM (DRDRAM) and Rambus dynamic RAM (RDRAM) etc.

It shall be noted that, in the present invention, terms "comprising", "including" or any other variations therefore intend to cover non-exclusive inclusion, so that, the process, device, article or method with a series of elements covers not only these elements, but also other elements not listed expressly, or elements that the process, device, article or method owns inherently. When no further limitations are included, elements that follow "comprising one" do not exclude additional existence of the same element in the process, device, article or method comprising such elements.

The foregoing paragraphs are preferred embodiments of the present invention, and are not intended to limit the protection scope of the present invention, equivalent structural or process variation made based on the specification and drawings of the present invention or direct or indirect use of the present invention in other related technical fields shall be similarly covered in the protection scope of the present invention.

The invention claimed is:

1. A battery charging management method, comprising: before starting charging a battery, obtaining an active handshake signal of the battery; conducting self-check of the battery according to the active handshake signal to determine whether the battery is working normally;
when the battery is working normally, selecting a corresponding charging mode to charge the battery;
wherein after selecting the corresponding charging mode to charge the battery when the battery is working normally, further comprising:
when charging the battery, monitoring a charging status parameter of the battery;
judging whether the battery is working normally according to the charging status parameter;
when the battery is not working normally, discontinuing charging; and
while the battery is being charged, a continuous evaluation of the battery takes place by:
determining instances where the battery temperature exceeds a threshold,
calculating a difference between the battery temperature and the threshold in each one of the instances and then averaging the differences in each of the instances to obtain an average difference,
using the average difference to determine a first possibility that the battery is not working normally using a database correlating battery condition and difference between battery temperature and threshold and also determining a second possibility of the battery not working normally from a number of times the battery temperature exceeded the average difference, and
calculating a number of the instances the battery temperature exceeded the threshold and using the number of the instances to determine whether the battery is working normally.

2. The battery charging management method according to claim 1, wherein the active handshake signal at least comprises battery life of the battery;
conducting self-check for the battery according to the active handshake signal, to determine whether the battery is working normally, comprising:
checking whether the battery life of the battery is lower than a threshold according to the battery life of the battery; when the battery life is lower than the threshold according to battery life of the battery, judging the battery is not working normally.

3. The battery charging management method according to claim 1, wherein the active handshake signal at least comprises the battery life of the battery;
and a method to obtain the battery life of the battery comprises:
acquiring feature information of the battery, and determining a corresponding target battery service life prediction model in a database according to the feature information; wherein the target battery service life prediction model comprises a deep learning model that has been trained;
acquiring usage information of the battery; and
inputting the usage information to the target battery service life prediction model to predict and obtain the battery life of the battery.

4. The battery charging management method according to claim 3, wherein acquiring the feature information of the battery, and determining the corresponding target battery service life prediction model in the database according to the feature information comprising:
obtaining the feature information of the battery, analyzing the feature information, and obtaining first feature information and second feature information; wherein the first feature information comprises manufacturer information and model information of the battery, and the second feature information comprises battery type information and battery production process information;

giving vectorization treatment to the first feature information and the second feature information, and obtaining a first feature vector and a second feature vector;

inputting the first feature vector and the second feature vector into a preset decision tree classification model for classification, obtaining the target battery service life prediction model corresponding to classification results; wherein the decision tree classification model is obtained by training in advance a decision tree neural network model.

5. A battery charging management device, comprising:
a signal acquisition unit, configured to obtain an active handshake signal of a battery before charging the battery;
an irregularity detection unit, configured to self-check the battery according to the active handshake signal and determine whether the battery is working normally; and
a charging unit, configured to select a corresponding charging mode to charge the battery if the battery is working normally;
wherein the battery charging management device further comprises:
a monitoring unit, configured to monitor a charging status parameter of the battery when charging the battery;
an irregularity judgment unit, configured to judge whether the battery is working normally according to the charging status parameter; and
an irregularity treatment unit, configured to discontinue charging when the battery is not working normally;
wherein the charging status parameter comprises a plurality of temperature information during charging of the battery;
wherein the irregularity judgment unit is specifically configured to:

detect a number of target temperature information that is bigger than a preset temperature value from the plurality of temperature information;
obtain a difference value between each of the target temperature information with the preset temperature value from the target temperature information that is bigger than the preset temperature value, and calculating an average difference value between each of the target temperature information and the preset temperature value;
obtain a first possibility in a preset database according to the average difference value; and obtain a second possibility in the preset database according to the number of the target temperature information; wherein correlations between the average difference value, the number and the possibilities are stored in the preset database; wherein the first possibility and the second possibility comprise respectively an irregularity possibility of the battery;
obtain a weighted value corresponding to the first possibility in the preset database according to the average difference value; and obtain a weighted value corresponding to the second possibility in the preset database according to the number of the target temperature information; wherein correlations between the average difference values, the number and the weighted values are stored in the preset database;
conduct weighted calculation using the first possibility and the second possibility and the weighted values corresponding to the first possibility and the second possibility and obtain a weighted irregularity possibility of the battery; and
judge the weighted irregularity possibility is bigger than an irregularity threshold, if bigger, judging the battery is not working normally; if not, judging the battery is working normally.

* * * * *